US006525395B1

(12) United States Patent
Kawase et al.

(10) Patent No.: US 6,525,395 B1
(45) Date of Patent: Feb. 25, 2003

(54) CHIP-TYPE COMPOSITE ELECTRONIC COMPONENT AND MANUFACTURING METHOD THEREOF

(75) Inventors: Masahiko Kawase, Yokaichi (JP); Hidenobu Kimoto, Omihachiman (JP)

(73) Assignee: Murata Manufacturing Co., Ltd., Kyoto (JP)

(*) Notice: Subject to any disclaimer, the term of this patent is extended or adjusted under 35 U.S.C. 154(b) by 27 days.

(21) Appl. No.: 09/690,870

(22) Filed: Oct. 17, 2000

(30) Foreign Application Priority Data

Oct. 19, 1999 (JP) .......................................... 11-296085

(51) Int. Cl.[7] .......................... H01C 7/10; H01L 23/48; B32B 31/24; H01G 4/008; H01G 4/12

(52) U.S. Cl. ...................... 257/528; 257/700; 257/701; 257/703; 257/758; 257/723; 257/725; 253/724; 253/532; 253/772; 361/306.1; 361/306.3; 361/311; 361/305; 361/106; 361/58; 338/22 R; 338/53; 338/55; 338/283; 338/210

(58) Field of Search ................................ 257/700, 701, 257/758, 528, 532, 703, 702, 693, 692, 772, 723, 725, 724; 361/306.1, 306.3, 311, 313, 106, 58, 111, 305, 303, 321.2; 338/22 R, 53, 55, 283, 210

(56) References Cited

U.S. PATENT DOCUMENTS

| | | | | | |
|---|---|---|---|---|---|
| 5,339,068 | A | * | 8/1994 | Tsunoda et al. | 338/332 |
| 5,796,568 | A | * | 8/1998 | Baiatu | 361/106 |
| 6,094,129 | A | * | 7/2000 | Baiatu | 338/22 R |
| 6,118,647 | A | * | 9/2000 | Okinaka et al. | 361/305 |
| 6,254,715 | B1 | * | 7/2001 | Okazaki et al. | 156/280 |
| 6,313,706 | B1 | * | 11/2001 | Kakuta et al. | 330/302 |
| 6,356,430 | B1 | * | 3/2002 | Yoshida et al. | 361/305 |
| 6,380,619 | B2 | * | 4/2002 | Ahiko et al. | 257/703 |
| 2002/0005588 | A1 | * | 1/2002 | Kimoto et al. | 257/772 |

FOREIGN PATENT DOCUMENTS

| | | |
|---|---|---|
| JP | 6-50312 | 7/1994 |

* cited by examiner

*Primary Examiner*—Alexander O. Williams
(74) *Attorney, Agent, or Firm*—Keating & Bennett, LLP

(57) ABSTRACT

An inductor obtained by laminating a plurality of ceramic layers having an internal coil conductor, and a thermistor obtained by laminating a plurality of ceramic layers having internal electrodes and having a predetermined resistance-temperature characteristic are laminated via an intermediate insulating layer. Both ends of the internal coil conductor of the inductor and the internal electrodes of the thermistor are connected to a pair of external electrodes. Thus, the inductor and the thermistor are connected in parallel.

8 Claims, 7 Drawing Sheets

CHIP-TYPE COMPOSITE ELECTRONIC COMPONENT AND MANUFACTURING METHOD THEREOF

BACKGROUND OF THE INVENTION

1. Field of the Invention

This invention relates to a chip-type composite electronic component and a manufacturing method thereof, and more particularly, to a composite electronic component of a chip inductor and a chip thermistor, and the manufacturing method thereof.

2. Description of the Related Art

A conventional high frequency filter is described in Japanese Utility Model Pub. No. 6-50312 and includes a laminate-type chip inductor. In the chip inductor, laminated ceramic layers form a chip element, a wound coil wraps around the inside of the chip element to connect the coil conductor of a ceramic interlayer via a through-hole provided in a ceramic layer. Ends of the coil are connected to different external electrodes.

In this kind of laminated type inductor, the impedance depends on the composition and the specific resistance of a ceramic material, the aperture-diameter dimension and the number of turns of a coil conductor, and the width and the material of the coil conductor. However, once a product is made, the frequency characteristic of the impedance is fixed and cannot be changed.

SUMMARY OF THE INVENTION

To overcome the above-described problems, preferred embodiments of the present invention provide a small-sized chip-type composite electronic component in which the impedance can be changed depending on the temperature, and a manufacturing method thereof. Moreover, preferred embodiments of the present invention provide a chip-type composite electronic component with a stable impedance characteristic and a manufacturing method thereof.

A chip type composite electronic component according to a preferred embodiment includes an inductor formed by laminating a plurality of ceramic layers having an internal coil conductor, and a thermistor formed by laminating a plurality of ceramic layers having an internal electrode and a predetermined resistance-temperature characteristic. At least one end of the internal coil conductor of the inductor and at least one end of the internal electrode of the thermistor are connected to a pair of external electrodes.

Since the chip-type composite electronic component of preferred embodiments of the present invention include a chip inductor and a chip thermistor laminated together to define one chip, a small-sized composite electronic component is obtained. Moreover, since the resistance value changes depending on the temperature, a thermistor is used to vary the impedance automatically depending on the working temperature. Thus, an inductor with a desired temperature characteristic is obtained.

The inductor and the thermistor may be connected in series or in parallel.

For example, since the resistance value of the thermistor increases drastically at a predetermined temperature or higher, when connecting a positive-characteristic thermistor (PTC thermistor) in series with an inductor, the circuit can be interrupted at the predetermined temperature or higher. In other words, the switch characteristic at a predetermined temperature can be used. Moreover, when PTC thermistor is connected in parallel with an inductor, the characteristic of the inductor can be returned to the characteristic as it is at the predetermined temperature or higher.

With some inductors, when a working temperature goes up, the component shows a positive temperature characteristic. Therefore, in some inductors the impedance rises. In such a case, using a parallel-connected NTC thermistor with an inductor functions to compensate for the temperature rise, and the temperature characteristic of the L component and the temperature characteristic of a resistance component offset each other. Thus, the inductor with a stable temperature characteristic is obtained.

The composite electronic component of various preferred embodiments of the present invention is used as a chip high-frequency filter with the above temperature characteristics in AC power supplies. However, in a DC power supply, since it can be used as a chip thermistor, one component can be used for both applications.

In another preferred embodiment of the present invention, an inductor and a thermistor are connected via an intermediate insulating layer. As a method of joining an inductor and a thermistor, a method of integrally baking after laminating green sheets is preferably used, more particularly, a method of attaching the inductor and the thermistor, respectively, after a baking process of the inductor and the thermistor is also used.

By the method described above, a diffusion is generated in the interlayer of an inductor layer and a thermistor layer. As a result, since characteristic degradation of a ceramic occurs, an inductor layer and a thermistor layer are laminated at both sides of a diffusion-prevention layer. Thus, a diffusion is prevented by baking and characteristic degradation is prevented. Moreover, since there is no possibility to generate a diffusion, the intermediate insulating layer may be an adhesive layer. Borosilicate lead system glass, or other suitable material can be used as an adhesive layer.

In addition, if the middle-material of the thermal expansion coefficient of the inductor and the thermistor is used as the intermediate insulating layer, the peeling of the inductor and the thermistor accompanied by the temperature change is eliminated.

Other features, characteristics, elements and advantages of the present invention will become apparent from the following description of preferred embodiments thereof with reference to the attached drawings.

DETAILED DESCRIPTION OF PREFERRED EMBODIMENTS

Figure 1:
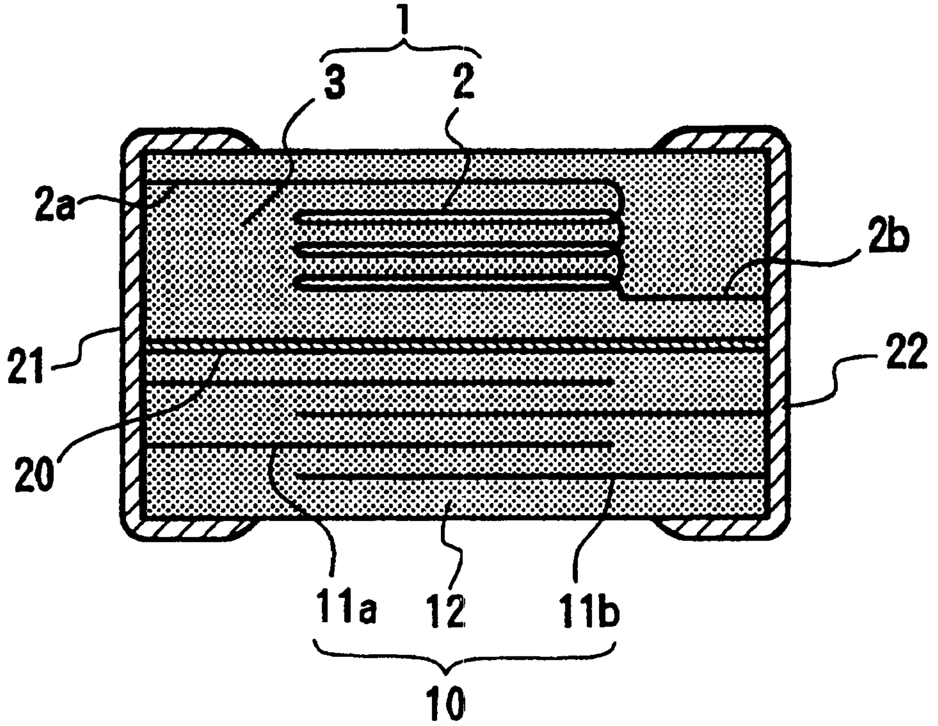
FIG. 1 is a sectional drawing of a first preferred embodiment of the chip-type composite electronic component according to the present invention.

FIG. 1 shows a preferred embodiment of a chip-type composite electronic component according to the present invention.

Figure 2:
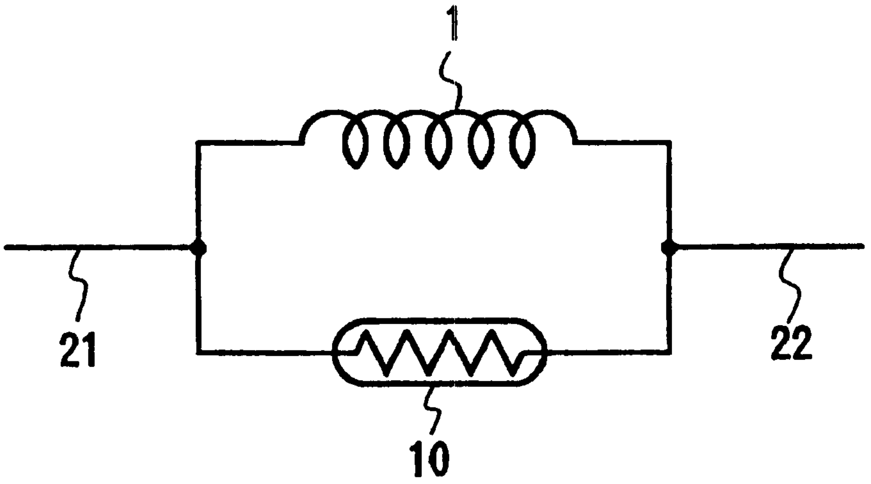
FIG. 2 is an electric-circuit diagram of FIG. 1.

This composite electronic component includes an inductor 1 having the internal coil conductor 2 inside a ceramic main body 3 which includes a ferrite magnetic substance, and a thermistor 10 having internal electrodes 11*a* and 11*b* inside the ceramic main body 12 which includes the thermistor material with a predetermined resistance-temperature characteristic are laminated with an intermediate insulating layer 20 sandwiched therebetween. One end 2*a* of the internal coil conductor 2 and the internal electrode 11*a* are connected to an external electrode 21. The other end 2*b* of the internal coil conductor 2 and the internal electrode 11*b* are connected to an external electrode 22. As shown in FIG. 2, the inductor 1 and the thermistor 10 are connected in parallel.

Figure 3:
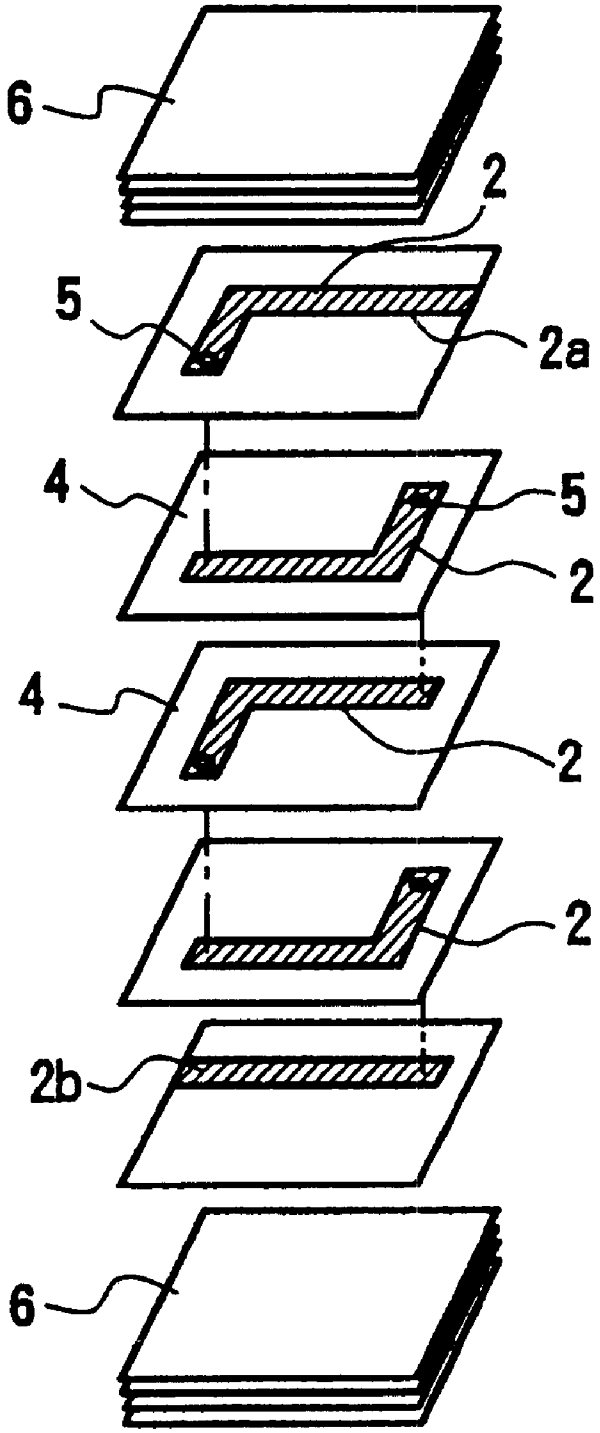
FIG. 3 is an exploded perspective view showing the structure of an inductor according to preferred embodiments of the present invention.

The inductor 1, as shown in FIG. 3, includes a spiral coil defined by laminating a plurality of ceramic layers 4 on the upper surface of which a substantially L-shaped coil conductor 2 is provided, such that coil conductors 2 are connected mutually through a conductor of a through-hole 5. In addition, drawer portions 2*a* and 2*b* are provided with only the coil conductor 2 of the ceramic layer 4 of uppermost layer and the coil conductor 2 of the lowermost layer, to connect the external electrodes 21 and 22. The drawer portions extend to different end surfaces. The shape of the coil conductor 2 and the number of sheets of the ceramic layer 4 are determined based upon a target inductance value. The cover sheets 6 having several ceramic layers which do not have conductors thereon are laminated on the lowermost portion and the uppermost portion of the laminated ceramic layer 4.

Figure 4:
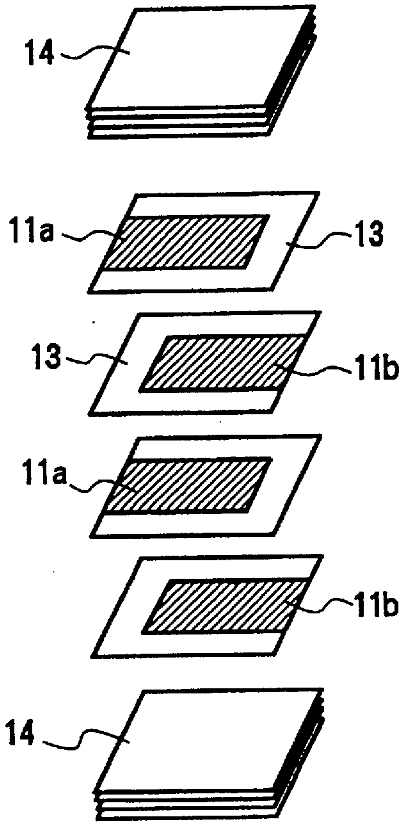
FIG. 4 is an exploded perspective view showing the structure of a thermistor according to preferred embodiments of the present invention.

As shown in FIG. 4, the thermistor 10 includes a ceramic layer 13 with an internal electrode 11*a* provided thereon which extends to one edge on the upper surface from the approximately central portion, and a ceramic layer 13 with an internal electrode 11*b* provided thereon which extends to another edge on the upper surface from the approximately central section are laminated together. Upper and lower internal electrodes 11*a* and 11*b* are overlapped in one portion. In addition, the shape of the internal electrodes 11*a* and 11*b* and the number of sheets of the ceramic layer 13 are determined based upon a target resistance value. The cover sheet 14, including a plurality of ceramic layers on which no electrodes are provided, are laminated on the lower part and the upper part of the laminated ceramic layer 13.

As for the intermediate insulating layer 20, an insulating layer or an adhesive layer that prevents diffusion between the ceramic main body 3 constituting an inductor 1 and the ceramic main body 12 constituting a thermistor 10 is provided. The inductor 1 and the thermistor 10 are laminated with the intermediate insulating layer 20 being sandwiched therebetween so that a compound multilayer body is provided. External electrodes 21 and 22 are provided on the end surface on which the electrodes 2, 11*a*, and 11*b* of the compound multilayer body are exposed, so as to form a composite electronic component. Formation of the external electrodes 21 and 22 is performed by well-known methods such as baking of Ag, plating (Ni—Sn, Ni—Sn—Sn/Pb), sputtering (a Monel-Ag-solder, Ag-solder, etc.), or other suitable methods.

Figure 5:
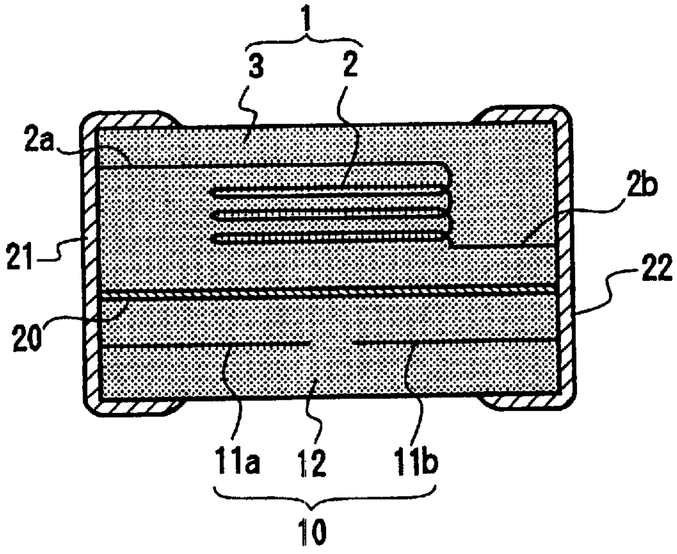
FIG. 5 is a sectional drawing of a second preferred embodiment of the chip-type composite electronic component according to the present invention.

In addition, in the thermistor 10 of this preferred embodiment, the internal electrodes 11*a* and 11*b* are arranged in parallel such that portions thereof overlap each other. However, as shown in FIG. 5, the internal electrodes 11*a* and 11*b* may have a flat surface arranged to oppose each other. In addition, any suitable shape is sufficient such as an arrangement in the shape of a step.

Moreover, the intermediate insulating layer 20 is provided depending on the need, and can be omitted.

Here, an example of a manufacturing method of the composite electronic component of having the unique structure of preferred embodiments of the present invention is explained.

First, the inductor characteristic sheet is formed as follows:

(1) $SiO_2$ and $Al_2O_3$ are preferably used as principal components. BaO and CaO or other suitable materials are preferably used as accessory components. Furthermore, after blending the raw material to which $B_2O_3$ is added for 15 hours with a ball mill, the material is dried.

(2) the obtained mixture is made to react at a high temperature of 800 degrees Celsius or more. Then, cooling pulverization is carried out. It is further dried, after pulverizing the mixture further with a ball mill.

(3) 10–15 weight % of a binder, 20 weight % of toluene, 20 weight % of ethanol, and 40 weight % of butanol are added to on the obtained material powder, and then, it is blended for 15 hours with the ball mill.

(4) The obtained slurry is shaped into an elongate sheet of 30–80 micrometers film thickness using a doctor blade method.

(5) A through hole is formed in a desired position of the green sheet which is cut into the elongate sheet having a suitable size. The through hole is positioned so that it is at the approximate middle point between the external electrodes of the chip element after cutting. The coil conductor corresponding to the position of this through hole is formed with Ag paste, AgPd paste, or other suitable material using a screen-printing method.

(6) The desired number of sheets of the printed green sheet of the obtained coil conductor are laminated. Then a plurality of sheets of the green sheet on which the coil conductor is not printed are laminated vertically as a cover sheet. Thus the inductor characteristic sheet is produced. In addition, as inductor material, besides the above-mentioned materials, Mn—Zn—Fe—O, Ni—Zn—Fe—O, Y—In—Ga—O, and other suitable materials may be used.

Next, a thermistor characteristic sheet is formed as follows:

In this case, an NTC thermistor is described as an example here.

(1) After blending thermistor material including some oxides of Mn, Ni, and Co, or other suitable material for 20 hours with a ball mill, it is dried.

(2) The obtained mixture is made to react at a high temperature of 800 degrees C. or more, cooling pulverization is carried out, and it is dried, after pulverizing it further with a ball mill.

(3) An organic binder, a dispersing agent, a wetting agent, an antifoamer, and water in desired amounts are added to the obtained material powder. Then it is blended for 16 hours with the ball mill.

(4) The obtained slurry is shaped into an elongate sheet of 30–80 micrometers film thickness using a doctor blade method.

(5) The internal electrode is formed with Ag paste, AgPd paste, other suitable material on the green sheet of the elongate sheet that is cut into the suitable size, using a screen-printing method.

(6) The desired number of sheets of the printed green sheets of the obtained internal electrode are laminated. Then a plurality of green sheets on which a coil conductor is not printed are laminated vertically as a cover sheet. Thus, the thermistor characteristic sheet is produced.

When the PTC thermistor is formed, as a thermistor material, oxides of yttrium, Mn, Pb, and other suitable material in desired amounts are added to a barium titanate. And then, it is made to be react at 1300 degrees C. After pulverizing, a sheet shaping is performed.

Finally, manufacturing of a composite electronic component is completed as follows:

(1) Inserting an insulating sheet between an inductor characteristic sheet and a thermistor characteristic sheet, and bonding the sheets at a pressure of 0.5t/cm2 to make the compound multilayer body.

(2) The obtained compound multilayer body is cut according to the chip dimension to obtain each chip element and then the chip element is baked for 4 to 8 hours at 900–1300 degrees C., after performing a 1 hour de-binder process at 500 degrees C.

(3) The end surface of the obtained sintered compact is ground so that the internal electrode is exposed. And Ag paste, AgPd paste, other suitable material as an external electrode are applied to the compact by a dip coating. It is baked at 800 degrees C. for 10 minutes, after drying it at 150 degrees C. for 15 minutes. As long as it is required, NiSn plating, solder dip, other suitable method may be provided. Or a foundation electrode may be formed by a sputtering method, or other suitable method. Moreover, the outside portion other than the external electrode of a chip element may be covered with the insulated skin layer. Thus, a composite electronic component is produced.

In the above explanation, baking is performed after carrying out the bonding-by-pressure laminate of green-sheet-like inductor characteristic sheet and a thermistor characteristic sheet. However, when each suitable baking temperature of an inductor characteristic sheet and a thermistor characteristic sheet differs, the laminate attachment is carried out using borosilicate lead system glass paste (intermediate insulating layer) etc. after baking an inductor characteristic sheet and a thermistor characteristic sheet at an individual temperature, respectively. And then, this compound multilayer body is cut into the chip dimension to obtain each chip element. In addition, in this case, it may be cut using a dicer or other suitable method as the method of cutting a compound multilayer body into a chip element. However, the break groove is provided beforehand in the phase of a green sheet. Accordingly, a break may be carried out along the break groove.

When forming a thermistor characteristic sheet, a plurality of green sheets on which internal electrodes are provided are laminated and then baked. However, in this case, there may be a possibility that the electric charge of the electrode material moves to a ceramic side, and an electrical potential difference is generated. As a result, a barrier layer may be formed and arranged to cause an electric obstruction. It may be hard to make resistance low. In order to prevent that, an internal electrode may be formed beforehand on a baked ceramic board. The laminate attachment may be carried out via an insulating layer. In this case, the thermistor is made with low resistance.

Figure 6:
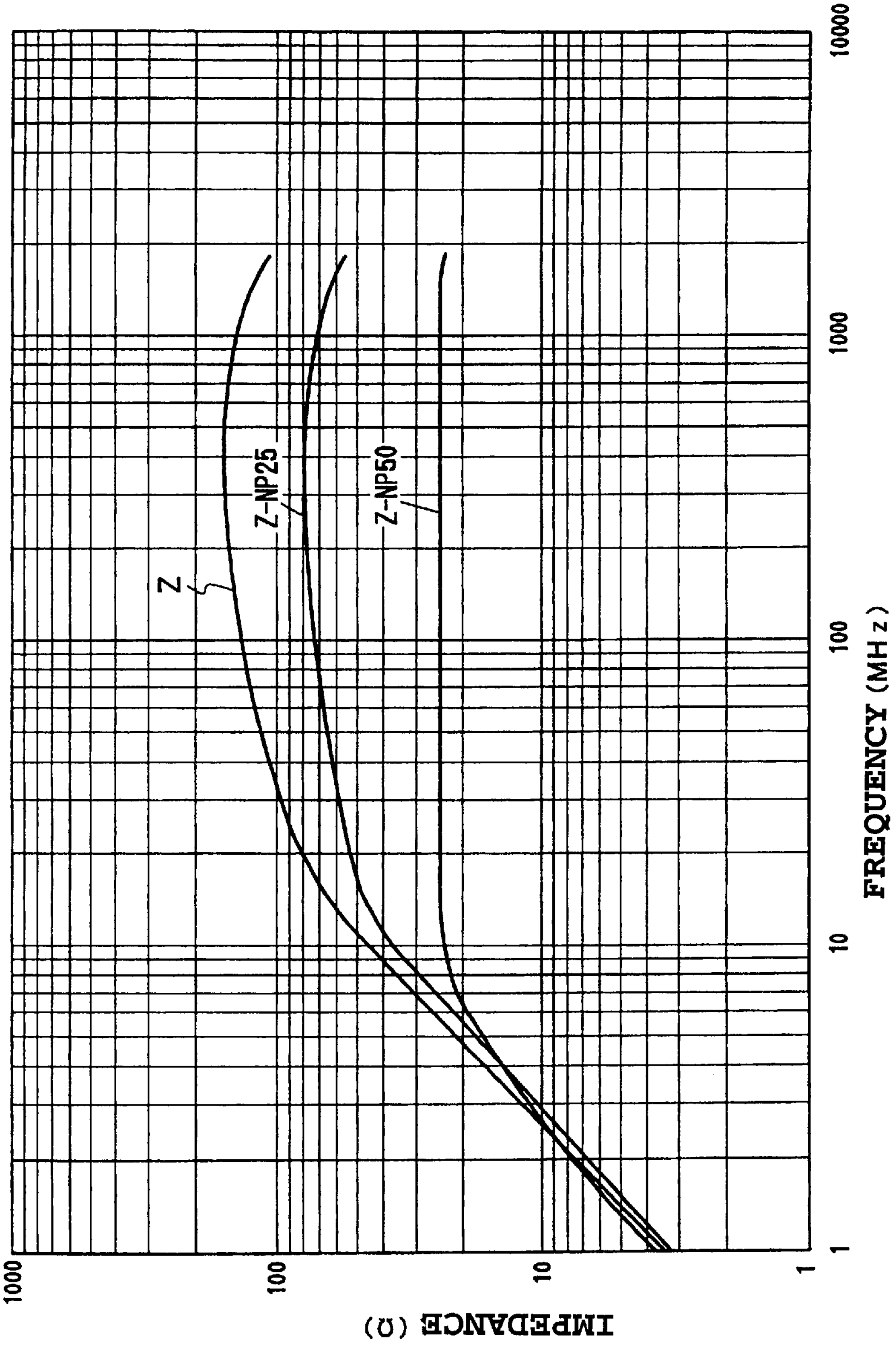
FIG. 6 is a frequency-characteristic diagram of the impedance value with the composite electronic component (parallel-connection form) of the inductor (simple substance) and the NTC thermistor.

FIG. 6 shows the frequency characteristic of the impedance of chip-inductor simple-substance Z, and chip-inductor Z-NP25 and Z-NP50 parallel connected with the NTC thermistor as mentioned above. Here, Z-NP25 shows the characteristic in 25 degrees C. Z-NP50 shows the characteristic in 50 degrees C.

An inductor has the impedance Z=120 ohm. The B constant of thermistor is 2900K. The NTC thermistor with the temperature characteristic of 220 ohm at 25 degrees C., and 40 ohm at 50 degrees C. was used in an example of preferred embodiments of the present invention.

In addition, the B constant expresses the size of the variation to the temperature of zero load-resistance value, and is the constant obtained from the arbitrary two temperatures.

FIG. 6 shows that the frequency characteristic is fixed in the case of inductor simple-substance Z, and that a maximum impedance is reduced to 25 ohm from 80 ohm by raising an ambient temperature from 25 degrees C. to 50 degrees C. in the case of the complex type inductor of preferred embodiments of the present invention. Conversely, by dropping the ambient temperature to 25 degrees C. from 50 degrees C., the maximum impedance is raised from 25 ohm to 85 ohm. Thus, an impedance characteristic is freely varied with temperature.

Moreover, since the rate of contribution of a resistance component is large in Z-NP50, an impedance is almost fixed (25 ohm) in the zone of 10 mHz–1000 mHz. Therefore, an inductor having a stable impedance characteristic in a wide band is obtained.

The above-described preferred embodiments illustrate an example of the parallel connection of an inductor and the thermistor. However, the inductor and thermistor may be connected in series.

Figure 7:
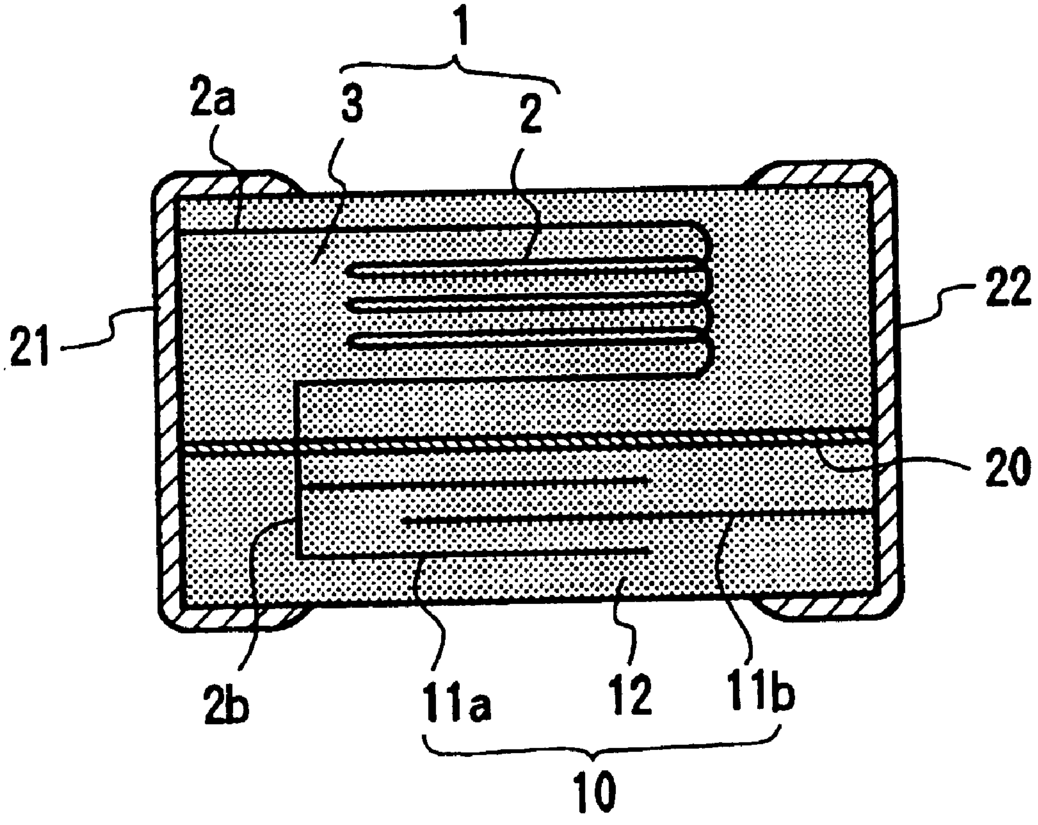
FIG. 7 is a sectional drawing of a third preferred embodiment of the chip-type composite electronic component according to the present invention.

FIG. 7 illustrates an example of the series connected composite electronic component. That is, one-end 2*a* of the internal coil conductor 2 of an inductor 1 is connected to one external electrode 21. Internal electrode 11*b* of a thermistor 10 is connected to the other external electrode 22. The other-end 2*b* of the internal coil conductor 2 of an inductor 1 and an internal electrode 11*a* of a thermistor 10 are mutually connected. The intermediate insulating layer 20 is provided between the inductor 1 and the thermistor 10. Alternatively, the intermediate insulating layer 20 may be omitted. The structure as shown in FIG. 5 may be used as a thermistor 10.

Figure 8:
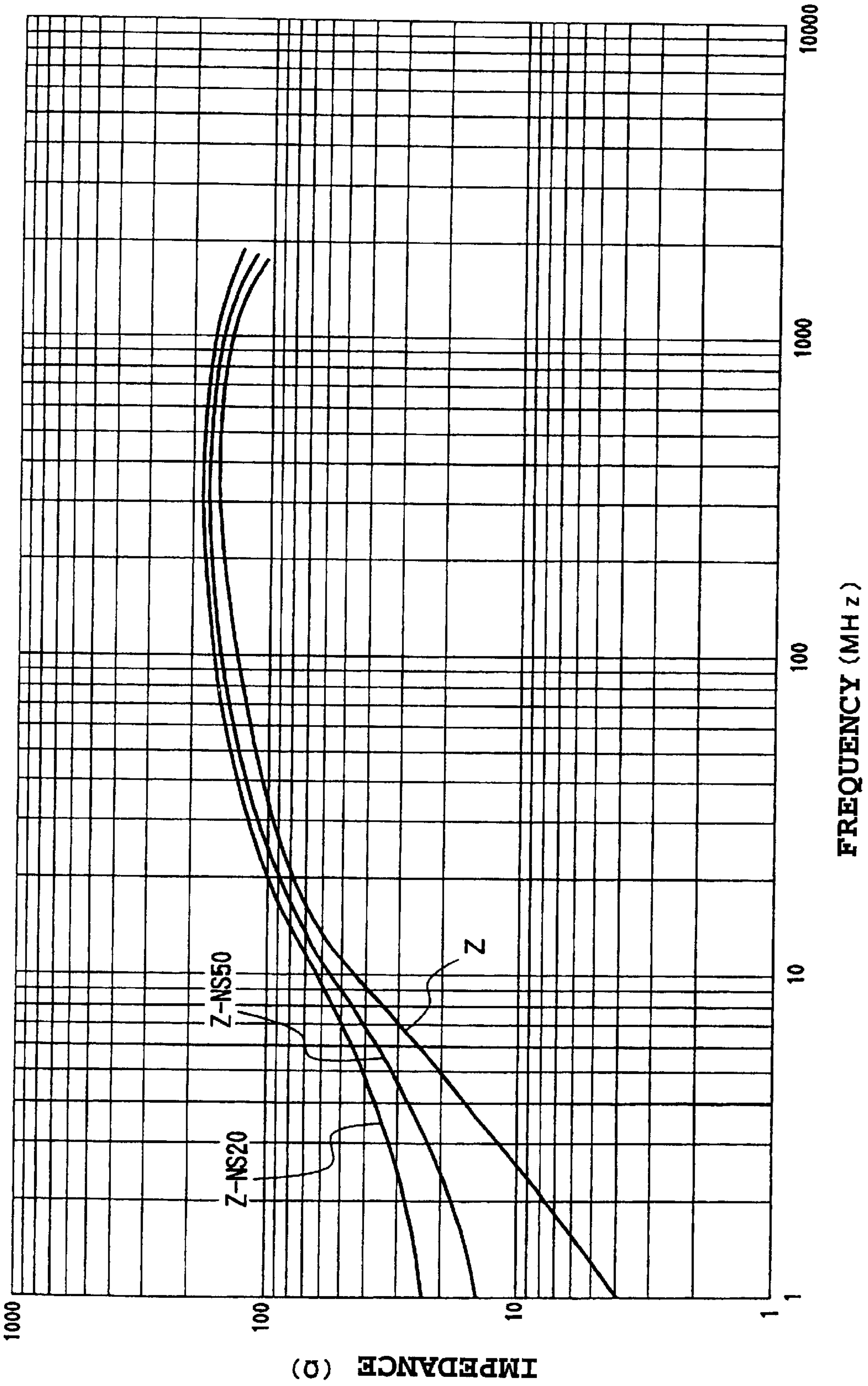
FIG. 8 is a frequency-characteristic diagram of the impedance value with the composite electronic component (series-connection type) of the inductor (simple substance) and the NTC thermistor.

FIG. 8 illustrates the frequency characteristic of the impedance of chip-inductor simple-substance Z, and chip-inductor Z-NS20 and Z-NS50 series connected with the NTC thermistor. Here, Z-NS20 shows the characteristic at 20 degrees C. Z-NS50 shows the characteristic at 50 degrees C.

The inductor Z as shown in FIG. 6 is used. An NTC thermistor with the temperature characteristic of at 20 ohm at 20 degrees C. and 10 ohm at 50 degrees C. is preferably used.

Figure 9:
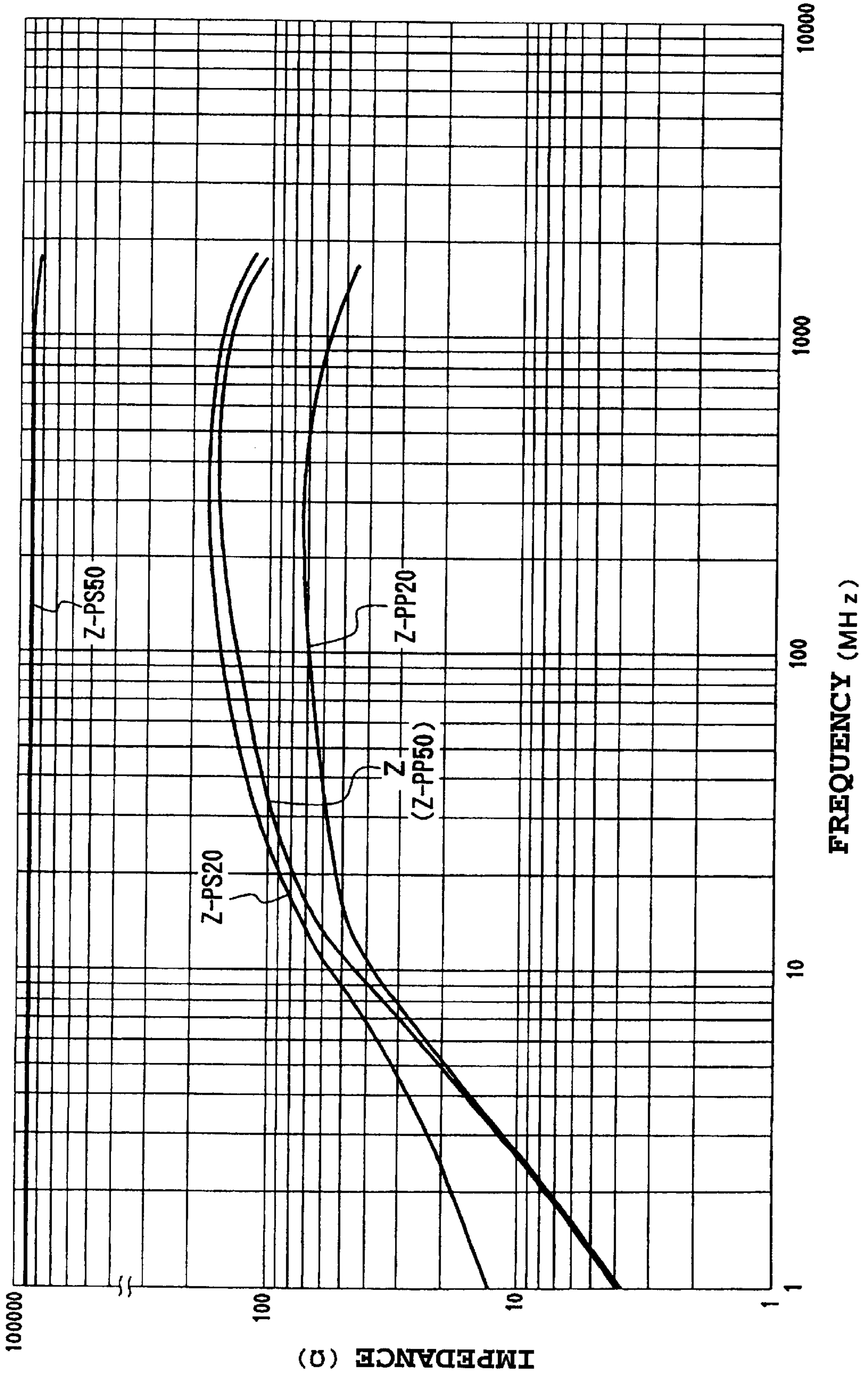
FIG. 9 is a frequency-characteristic diagram of the impedance value with the composite electronic component the inductor (simple substance) and the PTC thermistor.

FIG. 9 shows the frequency characteristic of the impedance of chip-inductor simple-substance Z, and the chip inductor series and parallel connected with the PTC thermistor. Here, Z-P S20 shows the characteristic at 20 degrees C. in the case of connecting in series. Z-PP20 shows the characteristic at 20 degrees C. in the case of carrying out a parallel connection. Z-P S50 shows the characteristic at 50 degrees C. in the case of connecting in series. Z-P P50 shows the characteristic at 50 degrees C. in the case of carrying out a parallel connection.

Here, the similar inductor Z shown in FIG. 6 is used. A PTC thermistor with a temperature characteristic of 10 ohm at 20 degrees C. and 90 ohm (40 degrees C. of Curie temperature) at 50 degrees C. is used.

FIG. 9 illustrates that when connecting PTC thermistor and an inductor in series, it has a similar characteristic of an inductor simple-substance Z at less than 40 degrees C. (Z-P S20). However, the impedance becomes very high at above 40 degrees C. (Z-P S50). This is the condition where the circuit has been substantially interrupted. In other words, a switch characteristic is given at close to 40 degree C. Moreover, where the PTC thermistor and the inductor is connected, an impedance is low at less than 40 degrees C. (Z-PP20), compared with that of inductor simple-substance Z. However, since it has a characteristic similar to an inductor simple-substance Z at above 40 degrees C. (Z-P P50), it is returned to a characteristic of an inductor as it is at 40 degrees C. or more.

In the method of baking after carrying out the bonding-by-pressure laminate of green-sheet-like inductor characteristic sheet and a thermistor characteristic sheet, the diffusion-prevention layer 20 is provided as an intermediate insulating layer. However, this intermediate insulating layer 20 can be omitted.

In co-firing of the intermediate insulating layer 20, SiO2, A1203-MgO, or other suitable material can be used. The pattern of the internal coil conductor provided on each ceramic layer constituting an inductor is not restricted to being substantially L shaped as shown in the preferred embodiments. Arbitrary shapes, such as a substantially U-shaped configuration, and other suitable shapes, can be used.

From the above explanation, according to the composite electronic component of preferred embodiments of the present invention, since the laminate integration of an inductor and a thermistor is performed to form one chip, a small-sized chip-type composite electronic component is achieved. By connecting an inductor and a thermistor in series or parallel, the impedance characteristic of the entire composite electronic component is automatically varied depending on the working temperature. The inductor with a desired temperature characteristic is obtained.

Since the resistance value of a thermistor becomes very high above a particular temperature when connecting PTC thermistor with an inductor in series, a circuit is interrupted at a particular temperature or higher. In other words, the switch characteristic at a particular temperature is achieved.

Moreover, when the PTC thermistor and the inductor are connected in parallel, an impedance is lowered at a particular temperature or less. At a predetermined temperature or higher, the impedance is returned to a characteristic of an inductor.

Moreover, by connecting the NTC thermistor and an inductor in parallel, the temperature characteristic of L component of an inductor and the temperature characteristic of a resistance component offset each other. Thus, an inductor with a stable temperature characteristic is obtained.

According to the manufacturing method of preferred embodiments of the present invention, since both an inductor and a thermistor are produced using a similar laminate method, the chip-type compound component with the feature of the present invention is produced with an excellent mass-production property and a stable quality.

While preferred embodiments of the invention have been disclosed, various modes of carrying out the principles of the present invention disclosed herein are contemplated as being within the scope of the following claims. Therefore, it is understood that the scope of the present invention is not to be limited except as otherwise set forth in the claims.

What is claimed is:

1. A chip-type composite electronic component comprising:

an inductor including a plurality of ceramic layers having an internal coil conductor laminated together, and a thermistor including a plurality of ceramic layers having an internal electrode and having a predetermined resistance-temperature characteristic, said inductor and said thermistor being laminated together; and a pair of external electrodes; wherein at least one end of the internal coil conductor of the inductor and at least one end of the internal electrode of the thermistor are connected to the pair of external electrodes.

2. A chip-type composite electronic component according to claim 1, wherein one end of the internal coil conductor of the inductor is connected to one of the pair of external electrode, one end of the internal electrode of the thermistor is connected to the other of the pair of the external electrode, and the other end of the internal coil conductor of the inductor and the other end of the internal electrode of the thermistor are connected together.

3. A chip-type composite electronic component according to claim 1, wherein one end of the internal coil conductor of the inductor and one end of the internal electrode of the thermistor are connected to one of the external electrodes, and the other end of the internal coil conductor of the inductor and the other end of the internal electrode of the thermistor are connected to the other of the external electrodes.

4. A chip-type composite electronic component according to claim 1, wherein the thermistor is a negative-characteristic thermistor.

5. A chip-type composite electronic component according to claim 1, wherein the thermistor is a positive-characteristic thermistor.

6. A chip-type composite electronic component according to claim 1, further comprising an intermediate insulating layer arranged such that the inductor and the thermistor are laminated via the intermediate insulating layer.

7. A chip-type composite electronic component according to claim 1, wherein said coil conductor of each of said plurality of ceramic layers is substantially L-shaped.

8. A chip-type composite electronic component according to claim 1, wherein said coil conductors of said plurality of ceramic layers are electrically connected to one another via through holes provided in end portions of said coil conductors.

* * * * *